(12) United States Patent
Chow et al.

(10) Patent No.: US 7,890,279 B1
(45) Date of Patent: Feb. 15, 2011

(54) JITTER ESTIMATION IN PHASE-LOCKED LOOPS

(75) Inventors: Daniel Tun Lai Chow, Foster City, CA (US); San Wong, Cupertino, CA (US); Vincent K. Tsui, Emeryville, CA (US); Lik Huay Lim, Penang (MY); Man On Wong, Gelugor (MY)

(73) Assignee: Altera Corporation, San Jose, CA (US)

( * ) Notice: Subject to any disclaimer, the term of this patent is extended or adjusted under 35 U.S.C. 154(b) by 207 days.

(21) Appl. No.: 12/189,744

(22) Filed: Aug. 11, 2008

(51) Int. Cl.
*G06F 19/00* (2006.01)
(52) U.S. Cl. ....................................... 702/72
(58) Field of Classification Search ............. 702/72, 702/60–64, 182–185
See application file for complete search history.

(56) References Cited

U.S. PATENT DOCUMENTS

2006/0141963 A1* 6/2006 Maxim et al. ............. 455/192.1

OTHER PUBLICATIONS

Chow et al., "A Jitter Estimation Method for Cascaded, Programmable Phase-Locked Loops." *DesignCon 2008*. Feb. 2008.
Daniel Chow, "Analysis of Crosstalk Effects on Jitter in Transceivers." *DesignCon 2008*. Feb. 2008.

* cited by examiner

*Primary Examiner*—Edward Raymond
(74) *Attorney, Agent, or Firm*—Weaver Austin Villeneuve & Sampson LLP

(57) ABSTRACT

A phase-locked loop is characterized by analyzing phase noise in its output signal while known levels of input phase noise are provided. The resulting data provides intrinsic phase noise and gain of the phase-locked loop. These values provide a general relationship between input phase noise and output phase noise for the phase-locked loop, which allows estimation of output phase noise corresponding to a given level of input phase noise, and allows estimation of input phase noise corresponding to a given level of output phase noise.

17 Claims, 4 Drawing Sheets

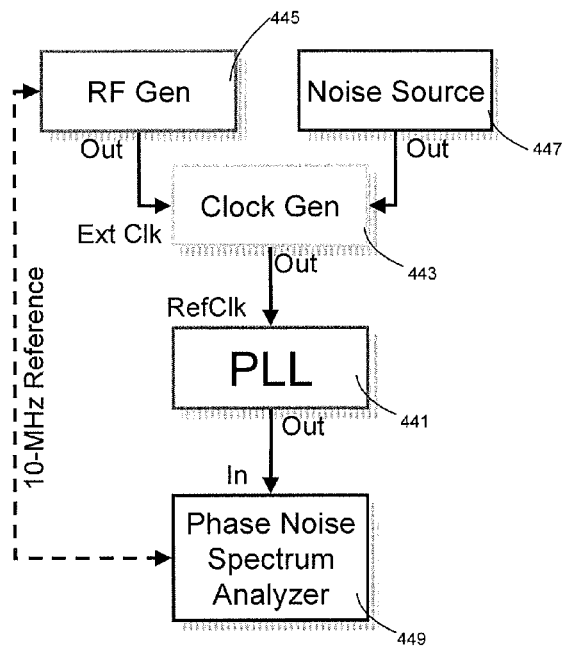
FIG. 4
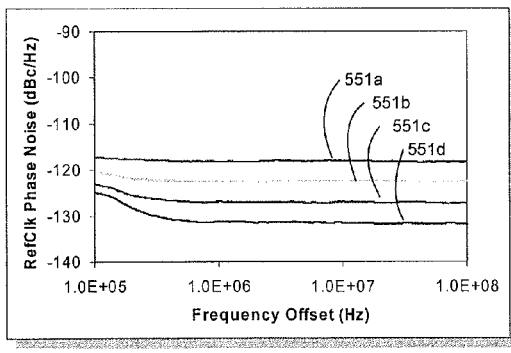
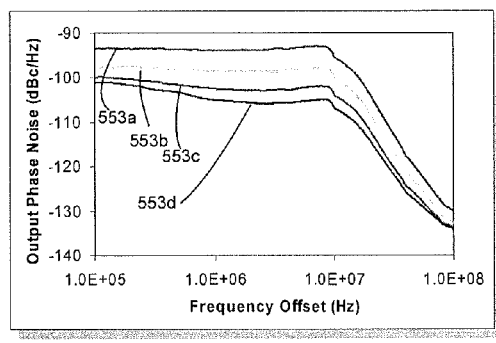
FIG. 5A            FIG. 5B

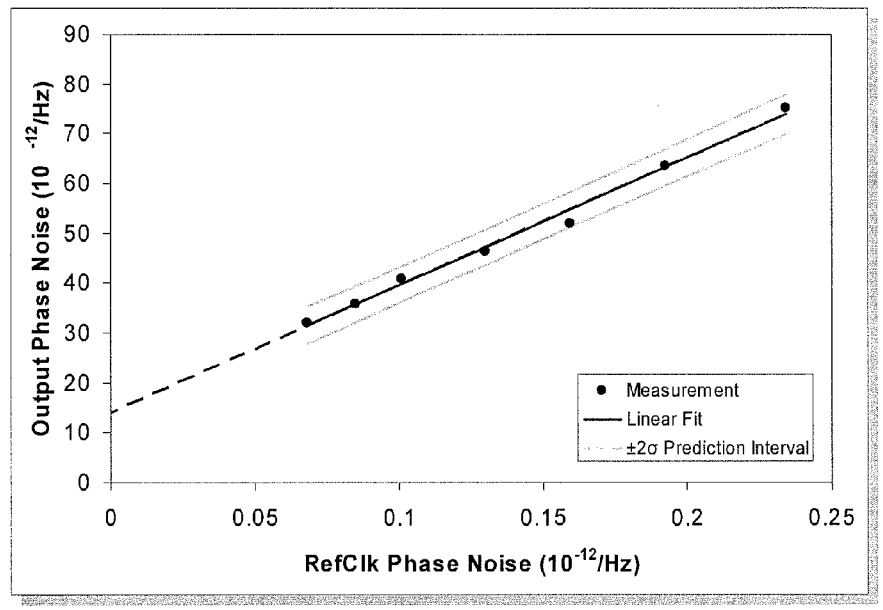
FIG. 6
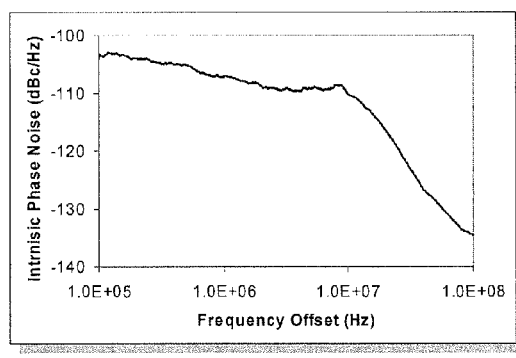 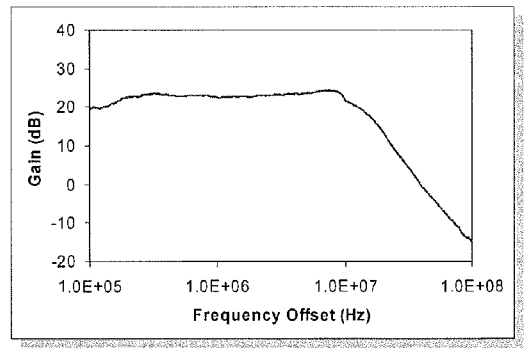
FIG. 7A          FIG. 7B

JITTER ESTIMATION IN PHASE-LOCKED LOOPS

TECHNICAL FIELD

The present disclosure relates to estimation of jitter in Phase-Locked Loops (PLLs) and to use of such estimation in IC design.

DESCRIPTION OF RELATED ART

It is known to incorporate phase-locked loop ("PLL") circuitry on programmable logic devices ("PLDs"). For example, it has become common for PLDs to accommodate various input/output standards, some of which require very accurate high-speed clocks. One way of providing such clocks is to provide PLL circuitry on the PLD.

A basic PLL includes a phase-frequency detector ("PFD"), a charge pump, a loop filter and a voltage-controlled oscillator ("VCO"), connected in series. The input or reference frequency is one input to the PFD. The output of the VCO, which is the output of the PLL, is also fed back to another input of the PFD. If the feedback signal is not locked to the input reference signal, then the PFD output will be a signal (voltage) whose sign is indicative of whether the output leads or lags and whose magnitude is indicative of the amount of lead or lag. That signal is filtered by the charge pump and loop filter and is input to the VCO, causing the output frequency to change. Eventually, the output signal will lock to the phase of the input reference signal. In this simple example, the output signal also will lock to the frequency of the input reference signal, but in most PLLS, counters on the input and output of the PLL are used to divide the input frequency, while a counter/divider in the feedback loop is used to multiply the input frequency. Thus the frequency of the output signal can be any rational multiple of the input frequency, but will be phase-locked to the input frequency. Many electronic systems use a master clock signal to synchronize the operation of all the circuitry and integrated circuit. A fundamental concept in electronic design, synchronous operation is important to ensure that logic operations are being performed correctly. In a system, an integrated circuit may generate its own internal clock based on the master clock signal. For example, this integrated circuit may be a microprocessor, ASIC, PLD, FPGA, or memory. The internal clock is synchronized with the master clock. And in order to ensure proper operation, it is often important to reduce skew for the internal clock of the integrated circuit.

It is known to include PLL circuitry on programmable logic devices to help counteract "skew" and excessive delay in clock signals propagating on the device. For example, PLL circuitry may be used to produce a clock signal which is advanced in time relative to a clock signal applied to the programmable logic device. The advanced clock signal is propagated to portions of the device that are relatively distant from the applied clock signal so that the propagation delay of the advanced clock signal brings it back into synchronism with the applied clock signal when it reaches the distant portions of the device. In this way all portions of the device receive synchronous clock signals and clock signal "skew" (different amounts of delay in different portions of the device) is reduced.

Phase-locked loops generally have a certain amount of noise associated with their output signals. In particular, phase noise or jitter may be present in such output signals. Such jitter may have a variety of sources including components within the phase-locked loop circuitry and components external to the phase-locked loop circuitry. Jitter is generally undesirable and a component receiving a signal with excessive jitter may not function as required. A particular component in an integrated circuit may require a clock signal with less than a maximum permissible jitter for the component to operate normally. However, accurate estimation of jitter at different points in a system may be challenging.

SUMMARY

According to an embodiment, phase noise related to a PLL is modeled using a single intrinsic phase noise factor for the PLL and a single gain factor. Values for intrinsic phase noise and gain may be obtained by providing a PLL with a clock signal that has a known amount of phase noise, and analyzing the output of the PLL. The values thus obtained (which may depend on frequency) may be used to predict phase noise in an output of the PLL for a given level of phase noise at the input, or to predict what level of phase noise at the input would cause a given level of phase noise at the output of the PLL.

In an example, a method comprises providing a reference clock signal to a phase-locked loop circuit, the reference clock signal having variable phase noise $P_{Ref}$; varying the phase noise $P_{Ref}$ of the reference clock signal; analyzing an output signal of the phase-locked loop circuit to obtain a measurement of phase noise $P_{Out}$ in the output signal as the phase noise $P_{Ref}$ of the reference clock signal is varied; and from the measurement, quantifying a relationship between the phase noise $P_{Ref}$ of the reference clock signal and the phase noise $P_{Out}$ of the output signal by obtaining a value for a gain factor G and a value for an intrinsic phase noise factor $P_{Int}$ in the equation $P_{Out} = P_{Ref} \times G + P_{Int}$.

In an example, a method of characterizing phase-noise of a phase-locked loop circuit comprises: providing a reference clock signal to an input of the phase-locked loop circuit; introducing input phase noise $P_{Ref}(f)$ into the reference clock signal over a range of frequency f, the input phase noise $P_{Ref}(f)$ introduced at two or more noise levels; measuring output phase noise $P_{Out}(f)$ over a range of frequency f, at the output of the phase-locked loop circuit as the input phase noise $P_{Ref}(f)$ is introduced at the two or more phase noise levels; and from the input phase noise $P_{Ref}(f)$ and the output phase noise $P_{Out}(f)$, calculating a value for an intrinsic phase noise $P_{Int}(f)$ of the phase-locked loop as a function of frequency f, and a value for a noise gain G(f) of the phase-locked loop, according to the equation $P_{Out}(f) = P_{Ref}(f) \times G(f) + P_{Int}(f)$.

In an example, software encoded on one or more computer readable media for execution is operable, when executed, to accept an input representing one of (i) phase noise $P_{Ref}(f)$ in an input signal and (ii) phase noise $P_{Out}(f)$ in an output signal of a phase-locked loop; and calculate the other one of (i) phase noise $P_{Ref}(f)$ in the input signal and (ii) phase noise $P_{Out}(f)$ in the output signal of the phase-locked loop according to the equation $P_{Out}(f) = P_{Ref}(f) \times G(f) + P_{Int}(f)$, where G(f) is an experimentally-obtained gain factor and $P_{Int}(f)$ is an experimentally-obtained intrinsic phase noise factor.

BRIEF DESCRIPTION OF THE DRAWINGS

The disclosure may best be understood by reference to the following description taken in conjunction with the accompanying drawings, which illustrate particular example embodiments.

FIG. 4 illustrates a test bench setup for characterizing a PLL.

FIG. 5A illustrates an example of input phase noise as a function of frequency for a variety of noise levels.

FIG. 5B illustrates output phase noise as a function of frequency for the input phase noise levels of FIG. 5A.

FIG. 6 illustrates output phase noise as a function of input phase noise for a particular frequency of FIGS. 5A and 5B.

FIG. 7A illustrates intrinsic phase noise as a function of frequency, calculated from the data shown in FIGS. 5A and 5B.

FIG. 7B illustrates gain as a function of frequency, calculated from the data shown in FIGS. 5A and 5B.

DETAILED DESCRIPTION

Reference will now be made in detail to some specific examples of the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. Furthermore, the techniques and mechanisms of the present invention will sometimes describe a connection between two entities. It should be noted that a connection between two entities does not necessarily mean a direct, unimpeded connection, as a variety of other entities may reside between the two entities.

EXAMPLE EMBODIMENTS

In typical phase-locked loop (PLL) applications, excessive noise in the PLL output is generally undesirable. Typically, a major concern surrounds timing noise, expressed as phase noise in the frequency domain or jitter in the time domain. Jitter generally refers to phase noise over a range of frequency and may be calculated by integrating phase noise over a certain bandwidth. The terms "phase noise" is used throughout this application, with phase noise being quantified in units of dBc/Hz (decibels relative to the carrier signal at a frequency offset from the carrier). The term phase noise power or noise power may also be used to describe phase noise or jitter expressed in terms of power. Phase noise can come from internal components of the PLL or external sources such as the reference clock or power supply. From an application perspective, it may be useful to understand how reference clock noise affects the output quality of a PLL. This is particularly useful in applications where PLLs are cascaded. That is, the output of one PLL serves as the reference clock for another PLL. In these applications, phase noise accumulates from one PLL to another. If the phase noise is excessive, a PLL at a later stage will lose its lock. Engineers may rely on qualitative assessments, general rules of thumb, and simulations to tackle this challenge, all of which require confirmation with measurements.

Figure 1:
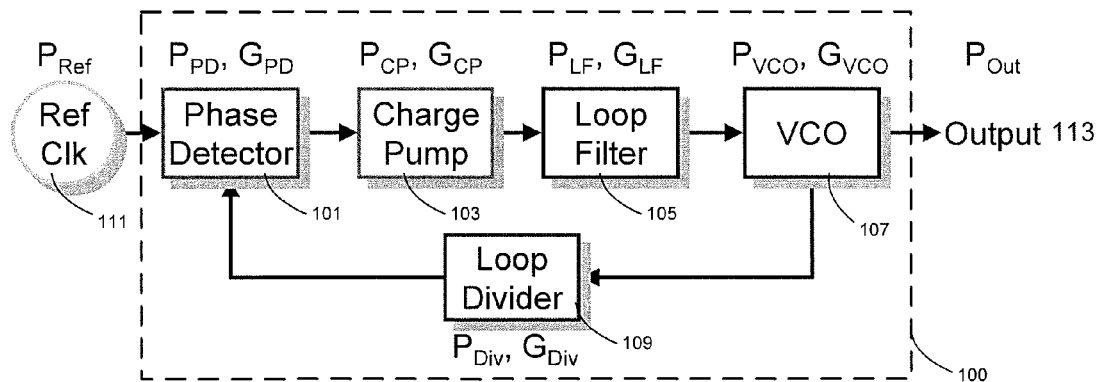
FIG. 1 illustrates a model of a PLL with individual intrinsic phase noise factors and gain factors for each component in the PLL.

FIG. 1 shows an example of a PLL 100 that includes a phase-frequency detector (phase detector) 101, charge pump 103, loop filter 105, voltage controlled oscillator 107, and a loop divider 109 as components. The PLL 100 receives a reference clock signal 111 that has a phase noise $P_{Ref}$ and provides an output 113 that has a phase noise $P_{Out}$. One way to characterize output jitter of a PLL is to model behavior of each component within the PLL. In the example of FIG. 1, a model is used that assigns an intrinsic phase noise factor and a gain factor to each component of the PLL. Thus, the phase detector 101 is assumed to have an intrinsic phase noise factor $P_{PD}$ and a gain factor $G_{PD}$, the charge pump 103 is assumed to have an intrinsic phase noise factor $P_{CP}$ and a gain factor $G_{CP}$, the loop filter 105 is assumed to have an intrinsic phase noise factor $P_{LF}$ and a gain factor $G_{LF}$, the VCO 107 is assumed to have an intrinsic phase noise factor $P_{VCO}$ and a gain factor $G_{VCO}$, and the loop divider 109 is assumed to have an intrinsic phase noise factor $P_{LD}$ and a gain factor $G_{LD}$. In closed loop operation, all of the intrinsic phase noise factors and gain factors interact to create the total phase noise at the PLL output. The intrinsic phase noise factor and gain factor of the individual components are often difficult or impossible to characterize. Some components may be simulated, but this generally requires correlation with measurements. Therefore, it is difficult to build an accurate PLL phase noise model based on component-by-component analysis.

Figure 2:
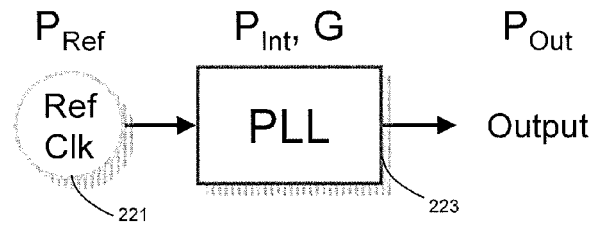
FIG. 2 illustrates another model of a PLL with a single intrinsic phase noise factor and a single gain factor for the entire PLL.

FIG. 2 shows an alternative model for characterizing phase noise of a PLL. In the model of FIG. 2, a reference clock 221 provides a signal with phase noise $P_{Ref}$ and PLL 223 provides an output with phase noise $P_{Out}$. However, unlike the previous example, instead of assigning separate intrinsic phase noise factors and gain factors to each component in a PLL, a single intrinsic phase noise factor $P_{Int}$ and a single gain factor G are assigned to PLL 223. The intrinsic phase noise factor $P_{Int}$ represents all phase noise added by PLL 223 and the gain factor G represents the entire phase noise gain of the PLL 223. More generally, phase noise may be considered over a range of frequency, and both phase noise factor $P_{Int}$ and gain G may be considered as functions of frequency (f) (i.e. frequency offset from the carrier) and may be written as $P_{Int}(f)$ and $G(f)$. From this model, for any frequency, the PLL output noise is simply the reference clock phase noise amplified by the closed-loop gain plus the PLL intrinsic phase noise as expressed by equation 1.

$$P_{Out}(f) = P_{Ref}(f) \times G(f) + P_{Int}(f) \qquad \text{Equation 1}$$

The phase noises $P_{Out}(f)$ and $P_{Ref}(f)$ correspond to the stimulus and response of the system. Both parameters are measurable as phase noise spectra. The intrinsic parameters $P_{Int}$ and G can be inferred by manipulating the stimulus and observing response of the PLL. This model quantifies the PLL intrinsic noise and noise transfer without any knowledge of the individual behavior of the individual components within the PLL. While the above analysis refers to analysis over a range of frequency as a general case, it will be understood that analysis may be performed at one or more discrete frequencies also.

Figure 3:
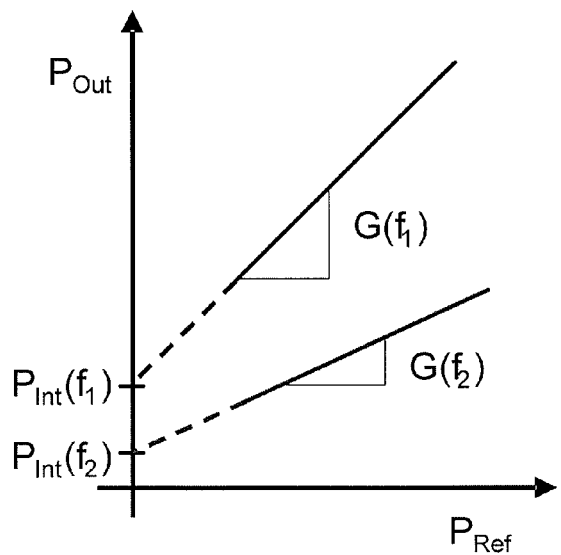
FIG. 3 illustrates output phase noise as a function of input phase noise for a PLL at two different frequencies.

FIG. 3 shows an example of output phase noise $P_{Out}$ versus input phase noise $P_{Ref}$ for two different discrete frequencies $f_1$ and $f_2$ for PLL 223. For frequency $f_1$, the intercept with the y-axis (output noise if $P_{Ref}$ was zero) is the intrinsic noise factor $P_{Int}(f_1)$ for the PLL at a frequency $f_1$. The slope of the plot gives the gain factor $G(f_1)$. Similarly, for frequency $f_2$, the y-intercept gives the intrinsic noise factor $P_{Int}(f)$ and the slope gives the gain factor $G(f_2)$. A similar analysis may be performed over a spectrum of frequencies to obtain intrinsic phase noise and gain factors as functions of frequency.

For the lumped-component linear noise model of FIG. 2, knowledge of $P_{Int}$ and G allows the prediction of $P_{out}$ for any $P_{Ref}$. The two quantities $P_{Int}$ and G can be found by careful manipulation of $P_{Ref}$ and observation of $P_{Out}$ using a benchtop characterization setup such as the setup shown in FIG. 4. In this arrangement, a PLL 441 (for example a transmitter PLL for a transceiver device) is configured with a reference clock 443, such as an Agilent 81134A, which is externally clocked by an RF generator 445 (for example, an Agilent 8257D) to minimize intrinsic noise in the clock generator. Controlled levels of phase noise are added to reference clock 445 by applying white voltage noise from a Noise Source 447 (for example, using a NoiseCom UFX 9836) to the time delay input of clock generator 443. The time delay converts input voltages into timing offsets in the clock signal with a ratio of 250 ps/V and a bandwidth of 200 MHz in this example. The PLL parameters may be configured with appropriate settings. For example, the settings of table 1 may be used.

Table 1

| Parameter | Value |
| --- | --- |
| f Ref | 150 MHz |
| Loop Divider | 20 |
| BW | 10 MHz |
| four | 3 GHz |

The reference clock output with added phase noise is applied to the reference clock input of the PLL 441. The PLL output (which may be passed through a buffer) is measured with a phase noise spectrum analyzer 449 (for example, an Agilent E4440A). In the example shown, the spectrum analyzer 449 and the RF generator are configured to share a 10-MHz time base reference. This may increase measurement accuracy and reduce wander.

From equation 1, the $P_{Ref}$ has a linear relationship with the $P_{Out}$, which was observed by varying the levels of noise added to the reference clock generator 443 by the noise source 447 and measuring the phase noise of the PLL output using the phase noise spectrum analyzer 449.

FIG. 5A shows examples of input phase noise $P_{Ref}$ in the clock signal RefClk provided to the PLL 441 over a frequency spectrum. Each line 551a-d of FIG. 5A represents the output of the clock generator for a given output of the noise source. Thus, as noise level from the noise source is stepped up, the phase noise in RefClk signal increases. FIG. 5B shows the measured phase noise spectra $P_{out}$ 553a-d with varying levels of added noise of FIG. 5A. Thus, for each level of input noise, there is an input noise spectrum shown in FIG. 5A and a corresponding output noise spectrum shown in FIG. 5B. For simplicity, only 4 selected noise levels are shown, although more levels may be used in characterizing a PLL.

Phase noise is measured for frequency offset $f_{Off}$=100 kHz-100 MHz in the present example. For $f_{Off}$<100 kHz, the intrinsic noise of the RF generator may be dominant in the setup, effectively masking the relationship expected in. The upper cut-off value of $f_{Off}$=100 MHz is sufficient to capture the PLL's in-band noise, though in other examples different cut-offs may be used.

Phase noise is typically expressed in a logarithmic scale given by equation 2:

$$L(f_{off}) = 10\log\left(\frac{P(f_{off})/\text{Hz}}{P_C}\right) \qquad \text{Equation 2}$$

where $f_{Off}$ is the frequency offset relative to the carrier frequency, L is phase noise in units of dBc/Hz, P is the single side-band power, and $P_C$ is the power of the carrier signal. For analysis using equation 1, all phase noise values are converted to a linear scale as a ratio of power density of the single side-band to the power of the carrier. That is, $$\left(\frac{P(f_{off})/\text{Hz}}{P_C}\right)$$

with units of 1/Hz.

For every $f_{Off}$, $P_{Out}$ is plotted against $P_{Ref}$. From equation 1, a linear fit of $P_{Out}$ vs. $P_{Ref}$ gives a slope and intercept corresponding to G and $P_{Int}$, respectively. FIG. 6 shows the least squares linear fit of Output phase noise $P_{Out}$ vs. RefClk phase noise $P_{Ref}$ for $f_{Off}$=8.6 MHz with an intercept of $P_{Int}$=1.41× $10^{-11}$ Hz$^{-1}$ (or −108.5 dBc/Hz).

For small phase errors, the behavior of a PLL may be purely linear, with G as the simple slope of the fit. However, for large phase errors, a PLL may deviate from linearity. As a result, G at high power may require a small correction factor. In one example, the value of G for $P_{Ref}$<0.251×$10^{-12}$ Hz$^{-1}$ (or −126 dBc/Hz) is 225.18 (or 23.5 dB) and G for $P_{Ref}$>0.251× $10^{-12}$ Hz$^{-1}$ (or −126 dBc/Hz) is 318.37 (or 25 dB). For this value of $f_{Off}$, the gain at high $P_{Ref}$ differs from the gain at low $P_{Ref}$ by ~20%. The division between low $P_{Ref}$ and high $P_{Ref}$ is determined by least squares fitting in this example. In other examples, more than two gain values may be used to cover a range of frequencies.

FIG. 6 also shows the 95% (±2σ) prediction intervals associated with the fit. The plotting and fitting of $P_{Out}$ vs. $P_{Ref}$ is repeated for every value of $f_{Off}$ in the phase noise spectra, resulting in $P_{Int}$ and G as functions of $f_{Off}$. Plots of $P_{Int}$ and G from 100 kHz to 100 MHz are shown in FIGS. 7A and 7B respectively, in logarithmic scales. These plots are obtained by performing the analysis shown in FIG. 6 on the data of FIGS. 5A and 5B.

$P_{Int}$ and G have a −3 dB corner and roll-off similar to the jitter transfer function of the PLL due to the loop filter. The low gain at high frequency indicates that reference clock noise tends to only impact the PLL output within the loop bandwidth. With $P_{Int}$ and G known, the PLL output phase noise power can be determined for any reference clock phase noise power.

The above characterization of a PLL may be verified by choosing a different RefClk frequency and measuring both input phase noise and output phase noise over some range of frequency offset. The resulting measurements may be compared with the predictions from equation 1 using the values of $P_{Int}$ and G found from actual measurement.

The predicted phase noise spectra can be integrated to give root mean square (rms) jitter values. Furthermore, the jitter values can easily be expressed with different reference frames such as phase jitter, period jitter, and/or cycle-to-cycle jitter by applying the appropriate transfer function. Table 2 shows an example of jitter values integrated from the predicted and measured phase noise spectra over the frequency range of 100 kHz to 100 MHz using an Agilent 81134A as the reference clock.

TABLE 2

Predicted and measured jitter values for Agilent 81134A as reference clock.

| Jitter (rms, 100 kHz-100 MHz) | Predicted | Measured |
|---|---|---|
| Phase | 1.12 ± 0.12 ps | 1.15 ps |
| Period | 30.4 ± 2.4 fs | 30.6 fs |
| Cycle-to-cycle | 2.9 ± 0.15 fs | 2.92 fs |

One application of the characterization process described above is to estimate jitter at the output of a PLL when the PLL is provided with a clock input having a particular phase noise, i.e. $P_{Out}$ can be found from a particular value of $P_{Ref}$. Equation 1 can also be used to estimate a level of phase noise in a clock signal that will provide a particular level of phase noise at the output of a PLL. Thus, for example, if a component is to receive a clock signal from the output of a PLL and the component requires that phase noise of the reference clock be less than some maximum value $P_{OutMax}$, equation 1 may be used to calculate what the corresponding maximum level of input phase noise $P_{RefMax}$ should be, (i.e. $P_{OutMax} = P_{RefMax} \times G + P_{Int}$). Thus, a range of acceptable phase noise in the output of the PLL (less than $P_{OutMax}$) may be used to calculate a range of acceptable phase in the reference clock signal (less than $P_{RefMax}$). The result may be used to select an appropriate component to provide the reference clock signal. In general, a more expensive component will be needed to provide a clock signal with less phase noise. So using a clock generator with the greatest tolerable amount of phase noise may be cost effective.

Cascaded PLLs

Figure 8:
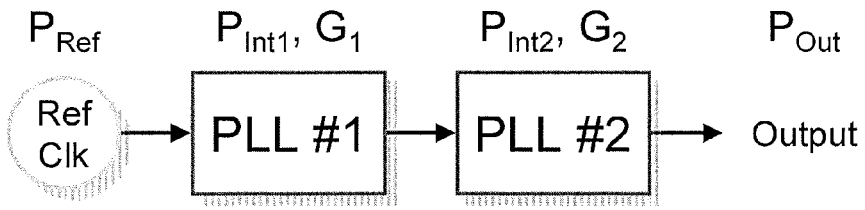
FIG. 8 illustrates a model of cascaded PLLs where each PLL has a single intrinsic phase noise factor and a single gain factor.

FIG. 8 illustrates a configuration where the output of a first PLL (PLL #1) is provided as a clock input to a second PLL (PLL #2). PLLs in this configuration may be referred to as cascaded PLLs. This type of configuration is common, for example where a clock signals are distributed over large integrated circuits. In this example, each PLL is considered to have a single intrinsic phase noise and gain. Each PLL may be characterized using a test bench setup as described earlier. The parameters $P_{Int1}$, $G_1$, $P_{Int2}$, and $G_2$ are the intrinsic noise powers and gains for PLL #1 (first-stage PLL) and PLL #2 (second-stage PLL), respectively. In this example, the reference clock phase noise ($P_{Ref}$) is transferred through PLL #1 and PLL #2, amplifying by $G_1$ and $G_2$ and accruing $P_{Int1}$ and $P_{Int2}$ along the way. Applying equation 1 for each PLL in sequence, the output noise power of cascaded PLLs is given by $$P_{Out}(f) = [P_{Ref}(f) \times G_1(f) + P_{Int1}(f)] \times G_2(f) + P_{Int2}(f). \qquad \text{Equation 3}$$

In other examples, three or more PLLs may be connected in series, with the output of one PLL providing an input to a subsequent PLL. The phase noise of the final output of such a sequence may be calculated if each PLL in the sequence is characterized so that its intrinsic phase noise and gain are known. Thus, by characterizing individual PLLs, the behavior of cascaded PLLs may be known.

While the discussion here refers to characterizing a PLL, it will be understood that this does not necessarily require characterizing the same physical component in order to estimate its output phase noise. In general, PLLs are made according to common designs and all PLLs made according to a particular design will have substantially the same characteristics, in particular they will generally have substantially the same intrinsic phase noise factor and gain factor. Thus, if the intrinsic phase noise factor and gain factor are obtained for a particular physical PLL circuit on a test bench, these factors may be said to be known for the PLL, meaning that they are known for physically separate circuits that are made according to the same design as the tested circuit.

Figure 9:
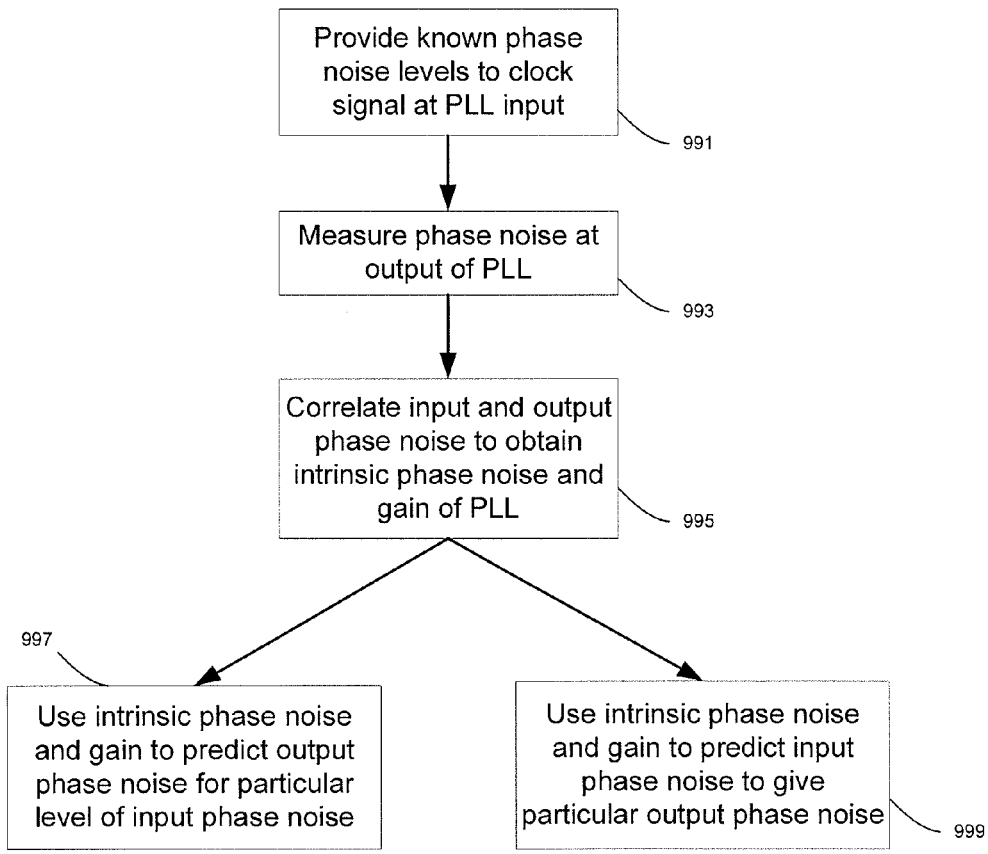
FIG. 9 illustrates a process for characterizing a PLL and using the results of such characterization.

FIG. 9 is a flowchart that illustrates some of the examples described above. A clock signal is provided 991 to an input of a PLL. The clock signal has a known level of phase noise introduced and the level of noise is varied. As the noise level at the input is varied, the phase noise at the output of the PLL is measured 993. The phase noise of the input and output of the PLL are then correlated 995 to obtain the intrinsic phase noise of the PLL and the gain of the PLL. These may be specific to one or more particular noise frequencies, or may be functions of frequency. These parameters may then be used to make predictions regarding the PLL. In one example 997, the intrinsic phase noise and gain are used to predict phase noise for a particular level of input phase noise. For example, if a clock generator has a known phase noise, it may be useful to know what phase noise would be produced by the PLL if it received an input from the clock generator. In another example 999, the intrinsic phase noise and gain are used to work back from a particular phase noise at an output of the PLL to see what input phase noise would correspond to the particular output phase noise.

Some of the above described methods may be partially or fully automated by using software configured for the purpose. For example, software may be used to accept input phase noise data and output phase noise data for a PLL, and from these sets of data the software may obtain values for the intrinsic phase noise of the PLL and the gain of the PLL. Software may also be used to calculate output phase noise for a PLL from input phase noise when the PLL is characterized. Software may also calculate an input phase noise that corresponds to a particular output phase noise, for example to find the maximum acceptable phase noise in a reference clock signal provided to a PLL. Such software may be provided by a manufacturer or vendor of PLLs or integrated circuits that contain PLLs. Software is generally embodied in one or more tangible computer readable media such as a hard disk drive (HDD), CD-ROM, flash memory card, or other medium. Software may be accessible over a network, such as the internet, to allow a user to enter input information and receive an output from the software at a remote location. For example, a manufacturer or vendor of a PLL may provide an online software application that models phase noise in a PLL. Thus, a customer or potential customer may enter phase noise for a known reference clock signal to obtain an estimate of phase noise at an output of a PLL. A customer may also input a phase noise requirement for a component receiving an output from a PLL and have the software generate a corresponding phase noise (or range of phase noise) in a reference clock signal to the PLL. The software may indicate a component, or components, capable of providing such a reference clock signal.

One particular example of an integrated circuit that may use one or more PLLs is a Programmable Logic Device (PLD). Such PLDs may have a number of Logical Elements (LEs), with each LE having a lookup table (LUT) that determines which output is provided when any given set of inputs is received. Aspects of the present invention may be useful in configuring such PLDs, which may be configured in many different ways for different applications. For example, in different applications phase noise in a PLL output may have to meet different requirements. A reference clock source may be chosen for a PLD according to the PLD configuration, so that phase noise is within acceptable limits throughout the PLD. As described above, phase noise at any point in a cascaded series of PLDs may be calculated for a given reference clock phase noise. Also, the maximum phase noise in the reference clock signal may be calculated for any given output phase noise requirement. This may be used to choose a component to provide the reference clock signal to the PLD.

Although many of the components and processes are described above in the singular for convenience, it will be appreciated by one of skill in the art that multiple components and repeated processes can also be used to practice the techniques of the present invention Although the foregoing invention has been described in some detail for purposes of clarity of understanding, it will be apparent that certain changes and modifications may be practiced within the scope of the appended claims. Therefore, the present embodiments are to be considered as illustrative and not restrictive and the invention is not to be limited to the details given herein, but may be modified within the scope and equivalents of the appended claims.

What is claimed is:

1. A method, comprising:
providing a reference clock signal to a phase-locked loop circuit, the reference clock signal having variable phase noise $P_{Ref}$;
varying the phase noise $P_{Ref}$ of the reference clock signal;
analyzing an output signal of the phase-locked loop circuit to obtain a measurement of phase noise $P_{Out}$ in the output signal as the phase noise $P_{Ref}$ of the reference clock signal is varied; and
from the measurement, quantifying a relationship between the phase noise $P_{Ref}$ of the reference clock signal and the phase noise $P_{Out}$ of the output signal by obtaining a value for a gain factor G and a value for an intrinsic phase noise factor $P_{Int}$ in the equation $P_{Out}=P_{Ref} \times G + P_{Int}$.

2. The method of claim 1 further comprising using the values of G and $P_{Int}$ thus obtained to calculate a value for the phase noise $P_{Out}$ of the output when the phase-locked loop receives a first clock signal having a first phase noise $P_1$ according to the equation: $P_{Out}=P_1 \times G + P_{Int}$.

3. The method of claim 2 further comprising additionally calculating a value for phase noise $P_{Out2}$ of an output of an additional phase-locked loop circuit that receives the output of the phase-locked loop circuit as an input, the additional calculation performed according to the equation $P_{Out2}=P_{out} \times G_2 + P_{Int2}$, where $G_2$ is a gain factor of the additional phase-locked loop circuit and $P_{Int2}$ is an intrinsic noise factor of the additional phase-locked loop.

4. The method of claim 3 wherein the phase-locked loop circuit and the additional phase-locked loop circuit are connected in series with one or more subsequent phase-locked loop circuits, the phase noise of the combination of the phase-locked loop circuit, the additional phase-locked loop circuit and the one or more subsequent phase-locked loop circuits are calculated using intrinsic noise factors and gain factors for each of the phase-locked loop, the additional phase-locked loop, and each of the one or more subsequent phase-locked loops.

5. The method of claim 1 further comprising using the values of G and $P_{Int}$ thus obtained to calculate a value for a maximum phase noise $P_{Refmax}$ in a clock signal to be provided to the phase-locked loop circuit from a maximum acceptable phase noise $P_{Outmax}$ in the output signal of the phase-locked loop according to the equation $P_{Outmax}=P_{Refmax} \times G + P_{Int}$.

6. The method of claim 1 wherein phase noise of the reference clock signal and phase noise of the output signal are analyzed over a range of frequencies, and the gain factor G and intrinsic phase noise factor $P_{Int}$ are obtained as functions of phase noise frequency.

7. A method of characterizing phase noise of a phase-locked loop circuit, comprising:
providing a reference clock signal to an input of the phase-locked loop circuit;
introducing input phase noise $P_{Ref}(f)$ into the reference clock signal over a range of frequency f, the input phase noise $P_{Ref}(f)$ introduced at two or more phase noise levels;
measuring output phase noise $P_{Out}(f)$ over a range of frequency f, at the output of the phase-locked loop circuit as the input phase noise $P_{Ref}(f)$ is introduced at the two or more phase noise levels; and
from the input phase noise $P_{Ref}(f)$ and the output phase noise $P_{Out}(f)$, calculating a value for an intrinsic phase noise $P_{Int}(f)$ of the phase-locked loop as a function of frequency f, and a value for a noise gain G(f) of the phase-locked loop, according to the equation $P_{out}(f)=P_{Ref}(f) \times G(f) + P_{Int}(f)$.

8. The method of claim 7 further comprising using the calculated values for G(f) and $P_{Int}(f)$ to calculate output phase noise from the phase-locked loop for a given input phase noise.

9. The method of claim 7 further comprising using the calculated values for G(f) and $P_{Int}(f)$ to calculate input phase noise from the phase-locked loop for a given output phase noise.

10. The method of claim 7 further comprising entering the calculated values of G(f) and $P_{Int}(f)$ into a software application that calculates phase noise in an output of the phase-locked loop corresponding to a given level of phase noise in the input.

11. The method of claim 7 further comprising entering the calculated values of G(f) and $P_{Int}(f)$ into a software application that calculates phase noise in the input of the phase-locked loop corresponding to a given level of phase noise in the output of the phase-locked loop.

12. The method of claim 7 further comprising estimating phase noise at an output of an additional phase-locked loop that receives the output of the phase-locked loop as an input, by calculating values for noise gain $G_2(f)$ and intrinsic phase noise $P_{Int2}(f)$ of the additional phase-locked loop and applying the equation $P_{Out2}(f)=P_{Out} \times G_2(f) + P_{Int2}$.

13. The method of claim 7 further comprising obtaining two or more values for noise gain G(f), the two or more values corresponding to noise gain at two or more ranges of input phase noise $P_{Ref}(f)$.

14. A non-transitory computer readable medium having computer code embodied therein, the non-transitory computer readable medium comprising:
computer code for accepting an input representing one of (i) phase noise $P_{Ref}(f)$ in an input signal provided to a phase-locked loop and (ii) phase noise $P_{Out}(f)$ in an output signal of the phase-locked loop; and
computer code for calculating the other one of (i) phase noise $P_{Ref}(f)$ in the input signal provided to the phase-locked loop and (ii) phase noise $P_{Out}(f)$ in the output signal of the phase-locked loop according to the equation $P_{Out}(f)=P_{Ref}(f) \times G(f) + P_{Int}(f)$, where G(f) is an experimentally-obtained gain factor and $P_{Int}(f)$ is an experimentally-obtained intrinsic phase noise factor.

15. The non-transitory computer readable medium of claim 14 further operable to accept an input representing a range of acceptable phase noise $P_{Out}(f)$ in the output signal of the phase-locked loop and calculate a corresponding range of acceptable phase noise $P_{Ref}(f)$ in the input signal provided to the phase-locked loop.

16. The non-transitory computer readable medium of claim 15 further operable to identify one or more suitable components to provide a clock reference signal within the range of acceptable phase noise $P_{Ref}(f)$ in the input signal provided to the phase-locked loop.

17. The non-transitory computer readable medium of claim 14 wherein the non-transitory computer readable medium is connected to a network and the computer codes are accessible over the network.

* * * * *